United States Patent
Khlat (10) Patent No.: US 11,082,009 B2
(45) Date of Patent: Aug. 3, 2021

(54) ENVELOPE TRACKING POWER AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/589,940

(22) Filed: Oct. 1, 2019

(65) Prior Publication Data

US 2020/0328720 A1    Oct. 15, 2020

Related U.S. Application Data

(60) Provisional application No. 62/833,327, filed on Apr. 12, 2019, provisional application No. 62/834,079, filed on Apr. 15, 2019.

(51) Int. Cl.
*H03F 3/04*     (2006.01)
*H03F 1/02*     (2006.01)
(Continued)

(52) U.S. Cl.
CPC .............. *H03F 1/0277* (2013.01); *H03F 3/19* (2013.01); *H03F 3/21* (2013.01); *H03F 1/0211* (2013.01);
(Continued)

(58) Field of Classification Search
CPC . H03F 1/0227; H03F 3/19; H03F 3/21; H03F 1/0211; H03F 3/211; H03F 1/32;
(Continued)

(56) References Cited

U.S. PATENT DOCUMENTS 5,838,732 A   11/1998 Carney
6,107,862 A   8/2000 Mukainakano et al.
(Continued)

FOREIGN PATENT DOCUMENTS

EP    3174199 A2   5/2017

OTHER PUBLICATIONS

Non-Final Office Action for U.S. Appl. No. 14/836,634, dated May 16, 2016, 9 pages.
(Continued)

*Primary Examiner* — Khanh V Nguyen
(74) *Attorney, Agent, or Firm* — Withrow & Terranova, P.L.L.C.

(57) ABSTRACT

An envelope tracking (ET) power amplifier apparatus is provided. In a non-limiting example, the ET power amplifier apparatus includes a single ET integrated circuit (ETIC) configured to support at least a pair of amplifier circuits for amplifying different radio frequency (RF) signals. One of the amplifier circuits may be configured to amplify a respective RF signal to a higher power and thus will operate based on an ET voltage whenever possible. Another amplifier circuit, on the other hand, may be configured to amplify a respective RF signal to a relatively lower power and thus will only operate based on the ET voltage when the other amplifier circuit is inactive. By employing a single ETIC, it may be possible to reduce footprint of the ET power amplifier apparatus, thus making it possible to fit the ET power amplifier apparatus into a small form factor electronic device, such as a wearable device.

20 Claims, 2 Drawing Sheets

(51) Int. Cl.
 *H03F 3/19* (2006.01)
 *H03F 3/21* (2006.01)
(52) U.S. Cl.
 CPC ...... *H03F 1/0244* (2013.01); *H03F 2200/102* (2013.01)
(58) Field of Classification Search
 CPC ......... H03F 2200/102; H03F 2200/451; H03F 3/245; H03F 1/0244; H03F 2200/504; H03F 1/305; H03F 3/04; H03F 2200/507; H04B 1/04; H04B 2001/0408; H02M 3/07; H03G 3/004; H03G 3/3042
 USPC ....................................................... 330/297
 See application file for complete search history.

(56) References Cited

U.S. PATENT DOCUMENTS

| | | | |
|---|---|---|---|
| 6,141,377 A | 10/2000 | Sharper et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 8,461,928 B2 | 6/2013 | Yahav et al. | |
| 8,493,141 B2 | 7/2013 | Khlat et al. | |
| 8,588,713 B2* | 11/2013 | Khlat .................. | H03F 1/0277 455/127.1 |
| 8,718,188 B2 | 5/2014 | Balteanu et al. | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 | 10/2014 | Wilson | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,020,451 B2 | 4/2015 | Khlat | |
| 9,041,364 B2 | 5/2015 | Khlat | |
| 9,041,365 B2 | 5/2015 | Kay et al. | |
| 9,055,529 B2 | 6/2015 | Shih | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 | 10/2015 | Hong et al. | |
| 9,166,830 B2 | 10/2015 | Camuffo et al. | |
| 9,167,514 B2 | 10/2015 | Dakshinamurthy et al. | |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,379,667 B2 | 6/2016 | Khlat et al. | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,923,520 B1 | 3/2018 | Abdelfattah et al. | |
| 10,003,416 B1 | 6/2018 | Lloyd | |
| 10,090,808 B1 | 10/2018 | Enzler et al. | |
| 10,097,145 B1 | 10/2018 | Khlat et al. | |
| 10,110,169 B2 | 10/2018 | Khesbak et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,291,181 B2 | 5/2019 | Kim et al. | |
| 10,382,071 B2 | 8/2019 | Rozek et al. | |
| 2002/0167827 A1 | 11/2002 | Umeda et al. | |
| 2004/0266366 A1 | 12/2004 | Robinson et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0240786 A1 | 10/2006 | Liu | |
| 2007/0052474 A1 | 3/2007 | Saito | |
| 2007/0258602 A1 | 11/2007 | Vepsalainen et al. | |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0308919 A1 | 12/2010 | Adamski et al. | |
| 2011/0074373 A1 | 3/2011 | Lin | |
| 2011/0136452 A1 | 6/2011 | Pratt et al. | |
| 2011/0175681 A1 | 7/2011 | Inamori et al. | |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 | 11/2012 | Southcombe et al. | |
| 2012/0299647 A1 | 11/2012 | Honjo et al. | |
| 2013/0021827 A1 | 1/2013 | Ye | |
| 2013/0100991 A1 | 4/2013 | Woo | |
| 2013/0130724 A1 | 5/2013 | Kumar Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2013/0271221 A1 | 10/2013 | Levesque et al. | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0057684 A1 | 2/2014 | Khlat | |
| 2014/0103995 A1 | 4/2014 | Langer | |
| 2014/0155002 A1 | 6/2014 | Dakshinamurthy et al. | |
| 2014/0184335 A1 | 7/2014 | Nobbe et al. | |
| 2014/0199949 A1 | 7/2014 | Nagode et al. | |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2014/0361837 A1 | 12/2014 | Strange et al. | |
| 2015/0048883 A1 | 2/2015 | Vinayak | |
| 2015/0071382 A1 | 3/2015 | Wu et al. | |
| 2015/0098523 A1 | 4/2015 | Lim et al. | |
| 2015/0155836 A1 | 6/2015 | Midya et al. | |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0065137 A1 | 3/2016 | Khlat | |
| 2016/0099687 A1 | 4/2016 | Khlat | |
| 2016/0105151 A1 | 4/2016 | Langer | |
| 2016/0118941 A1 | 4/2016 | Wang | |
| 2016/0126900 A1 | 5/2016 | Shute | |
| 2016/0173031 A1 | 6/2016 | Langer | |
| 2016/0181995 A1* | 6/2016 | Nentwig .................. | H03F 3/19 330/295 |
| 2016/0187627 A1 | 6/2016 | Abe | |
| 2016/0197627 A1 | 7/2016 | Qin et al. | |
| 2016/0226448 A1* | 8/2016 | Wimpenny ........... | H03F 1/0222 |
| 2016/0294587 A1 | 10/2016 | Jiang et al. | |
| 2017/0141736 A1 | 5/2017 | Pratt et al. | |
| 2017/0302183 A1 | 10/2017 | Young | |
| 2017/0317913 A1 | 11/2017 | Kim et al. | |
| 2017/0338773 A1 | 11/2017 | Balteanu et al. | |
| 2018/0048265 A1 | 2/2018 | Nentwig | |
| 2018/0048276 A1 | 2/2018 | Khlat et al. | |
| 2018/0076772 A1 | 3/2018 | Khesbak et al. | |
| 2018/0123453 A1 | 5/2018 | Puggelli et al. | |

(56) References Cited

U.S. PATENT DOCUMENTS

| | | | |
|---|---|---|---|
| 2018/0288697 A1 | 10/2018 | Camufto et al. | |
| 2018/0302042 A1 | 10/2018 | Zhang et al. | |
| 2018/0309414 A1 | 10/2018 | Khlat et al. | |
| 2018/0367101 A1 | 12/2018 | Chen et al. | |
| 2019/0044480 A1* | 2/2019 | Khlat | H03F 3/195 |
| 2019/0068234 A1 | 2/2019 | Khlat et al. | |
| 2019/0097277 A1 | 3/2019 | Fukae | |
| 2019/0109566 A1 | 4/2019 | Folkmann et al. | |
| 2019/0109613 A1 | 4/2019 | Khlat et al. | |
| 2019/0222175 A1 | 7/2019 | Khlat et al. | |
| 2019/0222178 A1 | 7/2019 | Khlat et al. | |
| 2019/0267956 A1 | 8/2019 | Granger-Jones et al. | |
| 2020/0007090 A1 | 1/2020 | Khlat et al. | |
| 2020/0036337 A1* | 1/2020 | Khlat | H03F 3/68 |
| 2020/0136561 A1 | 4/2020 | Khlat et al. | |
| 2020/0136575 A1 | 4/2020 | Khlat et al. | |
| 2020/0153394 A1 | 5/2020 | Khlat et al. | |
| 2020/0204116 A1 | 6/2020 | Khlat | |
| 2020/0228063 A1 | 7/2020 | Khlat | |
| 2020/0259456 A1 | 8/2020 | Khlat | |
| 2020/0259685 A1 | 8/2020 | Khlat | |
| 2020/0266766 A1 | 8/2020 | Khlat et al. | |

OTHER PUBLICATIONS

Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Notice of Allowance for U.S. Appl. No. 16/354,234, dated Apr. 24, 2020, 9 pages.
Final Office Action for U.S. Appl. No. 16/122,611, dated Sep. 18, 2020, 17 pages.
Final Office Action for U.S. Appl. No. 16/174,535, dated Jul. 1, 2020, 7 pages.
Notice of Allowance for U.S. Appl. No. 16/246,859, dated Sep. 18, 2020, 8 pages.
Non-Final Office Action for U.S. Appl. No. 16/284,023, dated Jun. 24, 2020, 7 pages.
Quayle Action for U.S. Appl. No. 16/421,905, dated Aug. 25, 2020, 5 pages.
Non-Final Office Action for U.S. Appl. No. 16/435,940, dated Jul. 23, 2020, 6 pages.
Non-Final Office Action for U.S. Appl. No. 16/774,060, dated Aug. 17, 2020, 6 pages.
Non-Final Office Action for U.S. Appl. No. 16/122,611, dated Mar. 11, 2020, 16 pages.
Notice of Allowance for U.S. Appl. No. 15/888,300, dated Jan. 14, 2020, 11 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 161689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Notice of Allowance for U.S. Appl. No. 16/689,236 dated Jun. 9, 2021, 7 pages.

(56) References Cited

OTHER PUBLICATIONS

Non-Final Office Action for U.S. Appl. No. 16/775,554, dated Jun. 14, 2021, 5 pages.
Non-Final Office Action for U.S. Appl. No. 16/582,471, dated Mar. 24, 2021, 11 pages.
Non-Final Office Action for U.S. Appl. No. 16/597,952, dated May 26, 2021, 7 pages.

* cited by examiner

ENVELOPE TRACKING POWER AMPLIFIER APPARATUS

RELATED APPLICATIONS

This application claims the benefit of provisional patent application Ser. No. 62/833,327, filed Apr. 12, 2019, and provisional patent application Ser. No. 62/834,079, filed Apr. 15, 2019, the disclosures of which are hereby incorporated herein by reference in their entireties.

FIELD OF THE DISCLOSURE

The technology of the disclosure relates generally to an envelope tracking (ET) radio frequency (RF) power amplifier apparatus.

BACKGROUND

Mobile communication devices, such as smartphones, have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience has also led to the rise of so-called wearable devices, such as smartwatches. Over time, these wearable devices have evolved from simple companion devices to mobile communication devices into full-fledged multi-functional wireless communication devices. Nowadays, most wearable electronic devices are often equipped with digital and analog circuitries capable of supporting a variety of wireless communication technologies, such as long-term evolution (LTE), Wi-Fi, and Bluetooth. Like mobile communication devices, wearable devices often employ sophisticated power amplifiers to help improve coverage range, data throughput, and reliability of the wearable devices.

Envelope tracking (ET) is a power management technology designed to improve efficiency levels of power amplifiers. In this regard, it may be desirable to employ ET across a variety of wireless communication technologies to help reduce power consumption and thermal dissipation in wearable devices.

SUMMARY

Embodiments of the disclosure relate to an envelope tracking (ET) power amplifier apparatus. In a non-limiting example, the ET power amplifier apparatus includes a single ET integrated circuit (ETIC) configured to support at least a pair of amplifier circuits for amplifying radio frequency (RF) signals associated with different wireless communication technologies. One of the amplifier circuits may be configured to amplify a respective RF signal to a higher power and thus will operate based on an ET voltage whenever possible. Another amplifier circuit, on the other hand, may be configured to amplify a respective RF signal to a relatively lower power and thus will only operate based on the ET voltage when the other amplifier circuit is inactive. By employing a single ETIC, it may be possible to reduce a footprint of the ET power amplifier apparatus, thus making it possible to fit the ET power amplifier apparatus into a small form factor electronic device, such as a wearable device.

In one aspect, an ET power amplifier apparatus is provided. The ET power amplifier apparatus includes a first amplifier circuit configured to amplify a first RF signal. The ET power amplifier apparatus also includes a second amplifier circuit configured to amplify a second RF signal. The ET power amplifier apparatus also includes an ETIC. The ETIC includes a first output port coupled to the first amplifier circuit. The ETIC also includes a second output port coupled to the second amplifier circuit. The ETIC also includes a control circuit. The control circuit is configured to determine whether the first amplifier circuit and the second amplifier circuit are active to amplify the first RF signal and the second RF signal, respectively. The control circuit is also configured to cause the second amplifier circuit to amplify the second RF signal based on a non-ET voltage in response to both the first amplifier circuit and the second amplifier circuit being active. The control circuit is also configured to cause the second amplifier circuit to amplify the second RF signal based on an ET voltage in response to the first amplifier circuit being inactive and the second amplifier circuit being active.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) power amplifier apparatus. In a non-limiting example, the ET power amplifier apparatus includes a single ET integrated circuit (ETIC) configured to support at least a pair of amplifier circuits for amplifying radio frequency (RF) signals associated with different wireless communication technologies. One of the amplifier circuits may be configured to amplify a respective RF signal to a higher power and thus will operate based on an ET voltage whenever possible. Another amplifier circuit, on the other hand, may be configured to amplify a respective RF signal to a relatively lower power and thus will only operate based on the ET voltage when the other amplifier circuit is inactive. By employing a single ETIC, it may be possible to reduce a footprint of the ET power amplifier apparatus, thus making it possible to fit the ET power amplifier apparatus into a small form factor electronic device, such as a wearable device.

Figure 1:
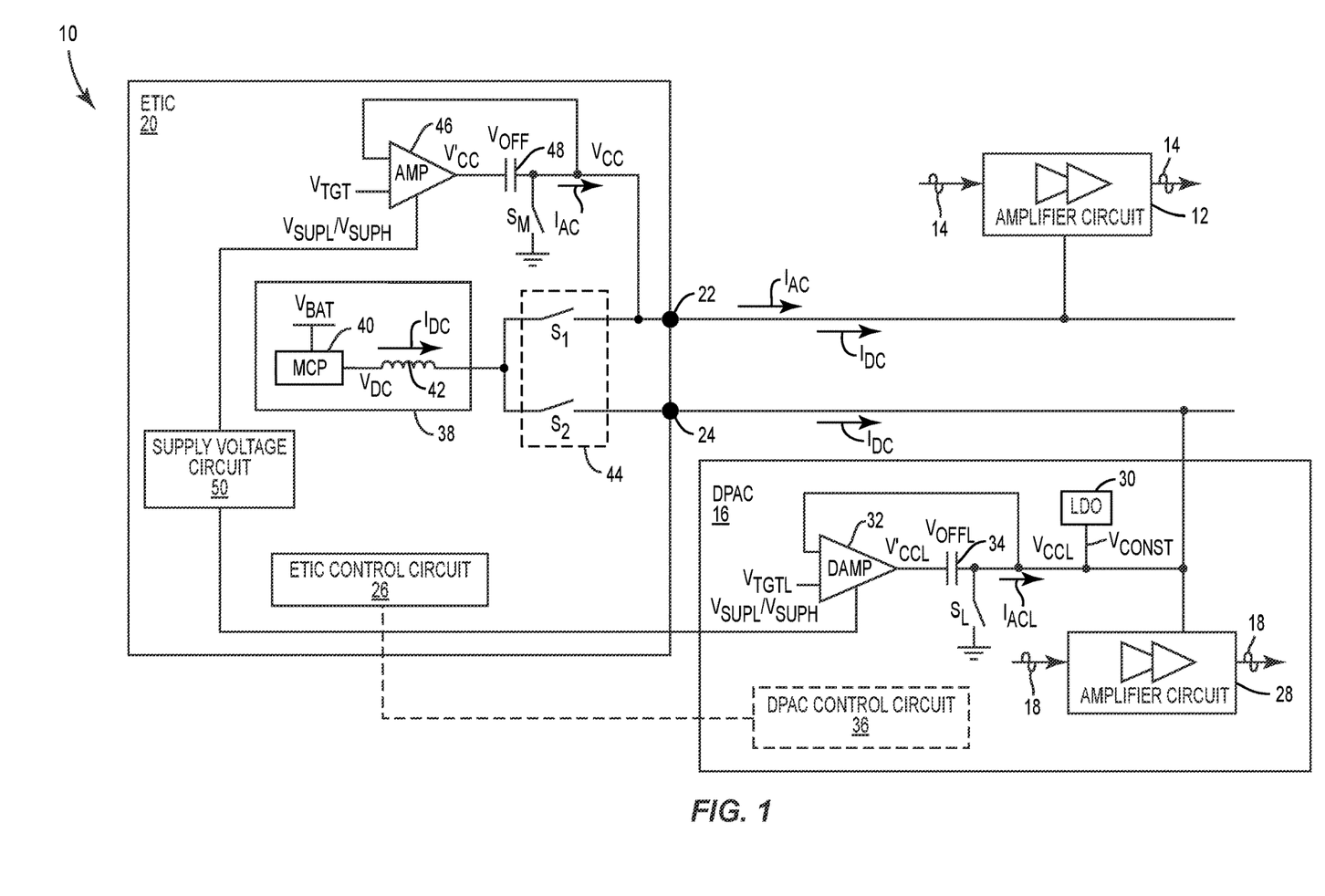
FIG. 1 is a schematic diagram of an exemplary ET power amplifier apparatus configured according to one embodiment of the present disclosure.

In this regard, FIG. 1 is a schematic diagram of an exemplary ET power amplifier apparatus 10 configured according to one embodiment of the present disclosure. The ET power amplifier apparatus 10 includes a first amplifier circuit 12 configured to amplify a first RF signal 14. The ET power amplifier apparatus 10 also includes a second amplifier circuit 16 (denoted as "DPAC") configured to amplify a second RF signal 18. In a non-limiting example, the first RF signal 14 corresponds to a wireless wide area network (WWAN) signal, such as a long-term evolution (LTE) signal, and the second RF signal 18 corresponds to a wireless local area network (WLAN) signal, such as a Wi-Fi signal. Notably, a WWAN is typically configured to operate in a larger coverage area (e.g., 1-mile radius), while the WLAN is typically configured to operate in a smaller coverage area (e.g. 100-meter radius). As such, the WWAN signal is required to be transmitted at a higher power than the WLAN signal.

As discussed in detail below, the first amplifier circuit 12 is configured to operate in an ET-mode to achieve a higher efficiency when amplifying the first RF signal 14 to the higher power. In contrast, the second amplifier circuit 16 is configured to operate in the ET-mode only when the first amplifier circuit 12 is inactive and operate in a non-ET mode when the first amplifier circuit 12 is active. As such, the ET power amplifier apparatus 10 may opportunistically enable the ET-mode between the first amplifier circuit 12 and the second amplifier circuit 16 to boost power amplification efficiency. In addition, the ET power amplifier apparatus 10 may be configured to share an ETIC 20 between the first amplifier circuit 12 and the second amplifier circuit 16, thus making it possible to fit the ET power amplifier apparatus 10 into a small form factor device, such as a wearable device.

In a non-limiting example, the ETIC 20 includes a first output port 22 and a second output port 24 that are coupled to the first amplifier circuit 12 and the second amplifier circuit 16, respectively. The ETIC 20 includes a control circuit 26 (denoted as "ETIC control circuit"), which can be a microprocessor, a microcontroller, or a field-programmable gate array (FPGA) for example. The control circuit 26 can be coupled to the first amplifier circuit 12 and the second amplifier circuit 16 via such standard interfaces as RF front-end (RFFE) and general-purpose input/output (GPIO), or any appropriate proprietary interface. The control circuit 26 is configured to determine whether the first amplifier circuit 12 and the second amplifier circuit 16 are active to amplify the first RF signal 14 and the second RF signal 18, respectively.

If the control circuit 26 determines that the first amplifier circuit 12 is active, then the control circuit 26 will cause the second amplifier circuit 16 to operate in the non-ET mode to amplify the second RF signal 18 based on a non-ET voltage, such as a constant voltage or an average power tracking (APT) voltage. In contrast, if the control circuit 26 determines that the first amplifier circuit 12 is inactive, then the control circuit 26 will cause the second amplifier circuit 16 to operate in the ET-mode to amplify the second RF signal 18 based on an ET voltage. In this regard, the first amplifier circuit 12 is given a priority over the second amplifier circuit 16 to operate in the ET-mode to boost power amplification efficiency at a higher power level.

The second amplifier circuit 16 may be coupled to the ETIC 20 over a relatively longer conductive trace than the first amplifier circuit 12. For example, the second amplifier circuit 16 can be provided on one edge of a wearable device to be close to a WLAN antenna, while the ETIC 20 and the first amplifier circuit 12 are provided on an opposite edge of the wearable device to be close to a WWAN antenna. As such, the second amplifier circuit 16 may be impacted by an increased trace inductance associated with the longer conduct trace, thus compromising efficiency and/or performance of the second amplifier circuit 16.

In this regard, the second amplifier circuit 16 may be configured to include a local amplifier circuit 28 configured to amplify the second RF signal 18.

The second amplifier circuit 16 may also include a low dropout regulator (LDO) 30 configured to generate a constant voltage $V_{CONST}$ at a variety of voltage levels. The second amplifier circuit 16 also includes a local voltage amplifier 32 (denoted as "DAMP"). The local voltage amplifier 32 is configured to generate an initial local ET voltage $V'_{CCL}$ based on a local ET target voltage $V_{TGTL}$. The second amplifier circuit 16 includes a local offset capacitor 34 configured to raise the initial local ET voltage $V'_{CCL}$ by a local offset voltage $V_{OFFL}$ to generate a local ET voltage $V_{CCL}$ ($V_{CCL}=V'_{CCL}+V_{OFFL}$). The second amplifier circuit 16 may include a local control circuit 36 (denoted as "DPAC control circuit"). The local control circuit 36 may be configured to communicate with the control circuit 26 via a standard or proprietary interface.

For example, when the control circuit 26 determines that the first amplifier circuit 12 is active, the control circuit 26 may communicate with the local control circuit 36 to cause the LDO 30 to provide the constant voltage $V_{CONST}$ (also referred to as a "non-ET voltage") to the local amplifier circuit 28 for amplifying the second RF signal 18. Accordingly, the local control circuit 36 may deactivate the local voltage amplifier 32 and/or close a local switch $S_L$ to isolate the local amplifier circuit 28 from the local voltage amplifier 32. In this regard, the local offset capacitor 34 may act as a bypass and stabilizing capacitor to the LDO 30.

When the control circuit 26 determines that the first amplifier circuit 12 is inactive, the control circuit 26 may communicate with the local control circuit 36 to cause the local voltage amplifier 32 to provide the local ET voltage $V_{CCL}$ (also referred to as an "ET voltage") to the local amplifier circuit 28 for amplifying the second RF signal 18. Accordingly, the local control circuit 36 may open the local switch $S_L$. Notably, the local amplifier circuit 28 may operate as a current source. As such, the local control circuit 36 may also cause the local voltage amplifier 32 to generate and provide a local high-frequency current $I_{ACL}$ (e.g., an alternating current) to the local amplifier circuit 28 concurrent to providing the local ET voltage $V_{CCL}$ to the local amplifier circuit 28.

The ETIC 20 can be configured to include a tracker circuit 38, which may include a multi-level charge pump (MCP) 40 and a power inductor 42. The MCP 40 may be configured to generate a low-frequency voltage $V_{DC}$ to cause the power inductor 42 to induce a low-frequency current $I_{DC}$ (e.g., a direct current). The ETIC can also include a front-end switch circuit 44 coupled to the power inductor 42. In a non-limiting example, the front-end switch circuit 44 includes a first switch $S_1$ and a second switch $S_2$ that are coupled to the first output port 22 and the second output port 24, respectively.

In a non-limiting example, the ETIC 20 can be configured to include a voltage amplifier 46 (denoted as "AMP"). The voltage amplifier 46 is configured to generate an initial primary ET voltage $V'_{CC}$ based on an ET target voltage $V_{TGT}$. The voltage amplifier 46 may be coupled to an offset capacitor 48, which is configured to raise the initial primary ET voltage $V'_{CC}$ by an offset voltage $V_{OFF}$ to generate a primary ET voltage $V_{CC}$ ($V_{CC}=V'_{CC}+V_{OFF}$) at the first output port 22. The voltage amplifier 46 may be further configured to source and provide a high-frequency current $I_{AC}$ (e.g., an alternating current) to the first output port 22. In this regard, the control circuit 26 may be configured to activate the voltage amplifier 46 to provide the primary ET voltage $V_{CC}$ and the high-frequency current $I_{AC}$ to the first output port 22, and thus to the first amplifier circuit 12 for amplifying the first RF signal 14. In contrast, when the control circuit 26 determines that the first amplifier circuit 12 is inactive, the control circuit 26 may deactivate the voltage amplifier 46 and/or close a main switch $S_M$ to isolate the voltage amplifier 46 from the first output port 22.

In one example, when the control circuit 26 determines that the first amplifier circuit 12 is active and the second amplifier circuit 16 is inactive, the control circuit 26 may control the front-end switch circuit 44 to close the switch $S_1$ and open the switch $S_2$. By closing the first switch $S_1$, the first amplifier circuit 12 may receive the low-frequency current $I_{DC}$, in addition to receiving the primary ET voltage $V_{CC}$ and the high-frequency current $I_{AC}$, for amplifying the first RF signal 14. By opening the second switch $S_2$, it may be possible to isolate a respective load impedance of the second amplifier circuit 16 from the ETIC 20.

In another example, when the control circuit 26 determines that the first amplifier circuit 12 is inactive and the second amplifier circuit 16 is active, the control circuit 26 may control the front-end switch circuit 44 to open the switch $S_1$ and close the switch $S_2$. By closing the second switch $S_2$, the second amplifier circuit 16 may receive the low-frequency current $I_{DC}$, in addition to receiving the local ET voltage $V_{CCL}$ and the local high-frequency current $I_{ACL}$, for amplifying the second RF signal 18. By opening the first switch $S_1$, it may be possible to isolate a respective load impedance of the first amplifier circuit 12 from the ETIC 20.

In another example, when the control circuit 26 determines that the first amplifier circuit 12 and the second amplifier circuit 16 are both active, the control circuit 26 may control the front-end switch circuit 44 to close the first switch $S_1$ and the second switch $S_2$. By closing the first switch $S_1$ and the second switch $S_2$, the first amplifier circuit 12 and the second amplifier circuit 16 may receive the low-frequency current $I_{DC}$. Accordingly, the first amplifier circuit 12 may amplify the first RF signal 14 based on the primary ET voltage $V_{CC}$, the high-frequency current $I_{AC}$, and the low-frequency current $I_{DC}$. Concurrently, the second amplifier circuit 16 may amplify the second RF signal 18 based on the local constant voltage $V_{CONST}$ and the low-frequency current $I_{DC}$.

In another example, when the control circuit 26 determines that the first amplifier circuit 12 and the second amplifier circuit 16 are both inactive, the control circuit 26 may control the front-end switch circuit 44 to open the switch $S_1$ and the switch $S_2$ to decouple the tracker circuit 38 from the first output port 22 and the second output port 24.

The MCP 40 can be configured to modulate the low-frequency voltage $V_{DC}$ as an average power tracking (APT) voltage. In a non-limiting example, when the control circuit 26 determines that the first amplifier circuit 12 is active and the second amplifier circuit 16 is inactive, the control circuit 26 can be configured to further determine (e.g., based on modulation bandwidth of the first RF signal 14) whether the first amplifier circuit 12 requires the primary ET voltage $V_{CC}$ for amplifying the first RF signal 14. If the control circuit 26 determines that the first amplifier circuit 12 does not require the primary ET voltage $V_{CC}$ for amplifying the first RF signal 14, the control circuit 26 may then close the switch $S_1$ to provide the low-frequency voltage $V_{DC}$ as an APT voltage to the first amplifier circuit 12. Accordingly, the control circuit 26 may deactivate the voltage amplifier 46.

In another non-limiting example, when the control circuit 26 determines that the first amplifier circuit 12 is inactive and the second amplifier circuit 16 is active, the control circuit 26 can be configured to further determine (e.g., based on modulation bandwidth of the second RF signal 18) whether the second amplifier circuit 16 requires the local ET voltage $V_{CCL}$ for amplifying the second RF signal 18. If the control circuit 26 determines that the second amplifier circuit 16 does not require the local ET voltage $V_{CCL}$ for amplifying the second RF signal 18, the control circuit 26 may then close the switch $S_2$ to provide the low-frequency voltage $V_{DC}$ as an APT voltage to the second amplifier circuit 16. Accordingly, the control circuit 26 may deactivate the local voltage amplifier 32.

The ETIC 20 may be further configured to include a supply voltage circuit 50 configured to generate and provide a low supply voltage $V_{SUPL}$ or a high supply voltage $V_{SUPH}$ to the voltage amplifier 46 and the local voltage amplifier 32. In a non-limiting example, the control circuit 26 can control the supply voltage circuit 50 to provide either the low supply voltage $V_{SUPL}$ or the high supply voltage $V_{SUPH}$ to the voltage amplifier 46 based on modulation bandwidth and/or power requirement of the first RF signal 14. In contrast, the control circuit 26 can control the supply voltage circuit 50 to provide either the low supply voltage $V_{SUPL}$ or the high supply voltage $V_{SUPH}$ to the local voltage amplifier 32 based on a static configuration (e.g., in a register).

Figure 2:
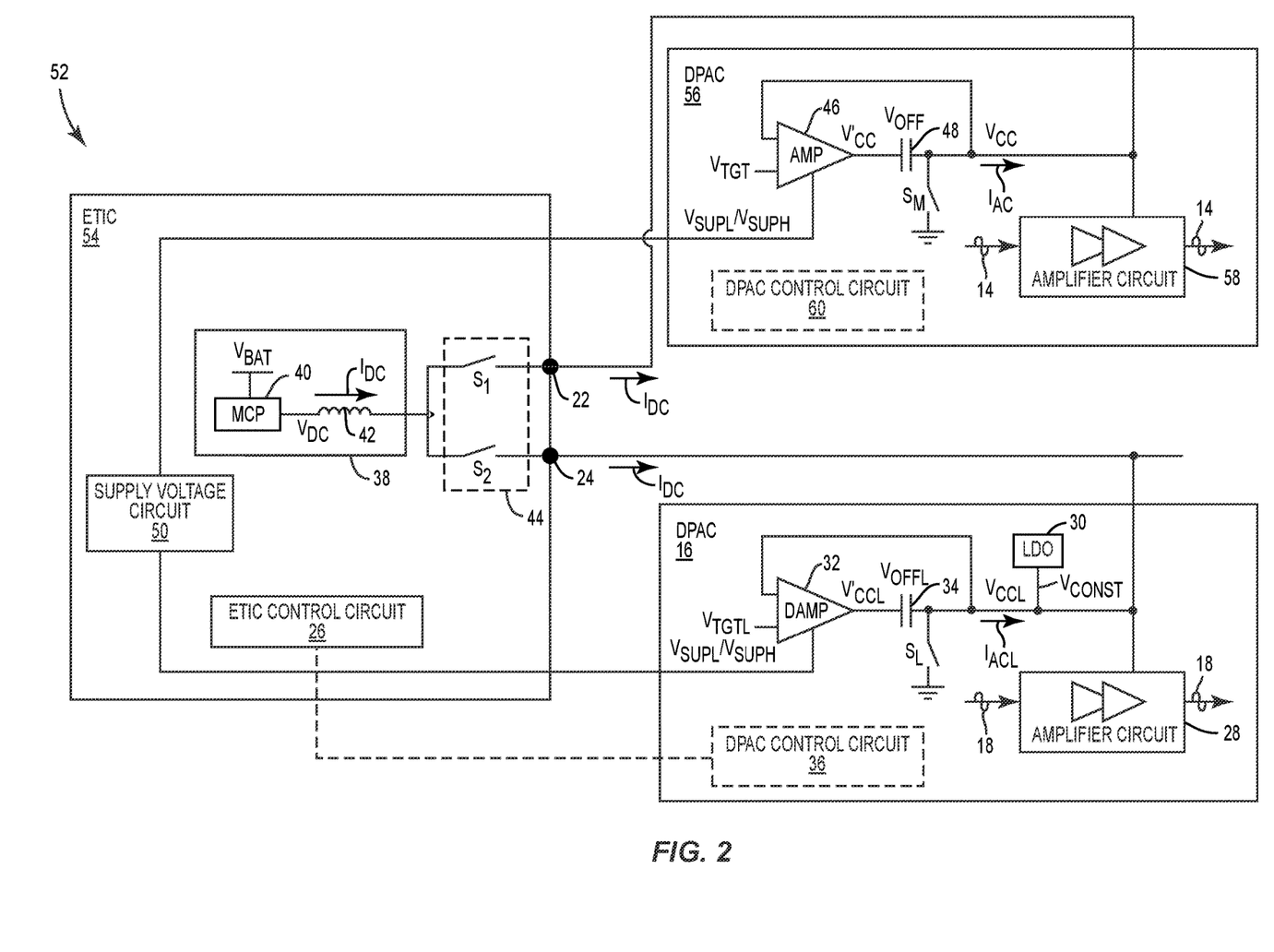
FIG. 2 is a schematic diagram of an exemplary ET power amplifier apparatus configured according to another embodiment of the present disclosure.

FIG. 2 is a schematic diagram of an exemplary ET power amplifier apparatus 52 configured according to another embodiment of the present disclosure. Common elements between FIGS. 1 and 2 are shown therein with common element numbers and will not be re-described herein.

The ET power amplifier apparatus 52 includes an ETIC 54, a first amplifier circuit 56 (denoted as "DPAC"), and the second amplifier circuit 16 (denoted as "DPAC"). The ET power amplifier apparatus 52 differs from the ET power amplifier apparatus 10 of FIG. 1 in that the voltage amplifier 46, the offset capacitor 48, and the main switch $S_M$ are moved from the ETIC 54 to the first amplifier circuit 56. In this regard, the first amplifier circuit 56 is similar to the second amplifier circuit 16 and can be disposed farther away from the ETIC 54.

More specifically, the first amplifier circuit 56 includes an amplifier circuit 58 configured to amplify the first RF signal 14. The voltage amplifier 46 is configured to generate the initial primary ET voltage $V'_{CC}$ based on the ET target voltage $V_{TGT}$. The voltage amplifier 46 may be coupled to the offset capacitor 48, which is configured to raise the initial primary ET voltage $V'_{CC}$ by the offset voltage $V_{OFF}$ to generate the primary ET voltage $V_{CC}$ ($V_{CC}=V'_{CC}+V_{OFF}$). Accordingly, the amplifier circuit 58 amplifies the first RF signal 14 based on the primary ET voltage $V_{CC}$. The first amplifier circuit 56 may include a respective control circuit 60 (denoted as "DPAC control circuit"), which can be coupled to the control circuit 26 in the ETIC 54 via standard or proprietary interface.

When the control circuit 26 determines that the first amplifier circuit 56 is active, the control circuit 26 may close the first switch S1 to couple the tracker circuit 38 to the first output port 22 to provide the low-frequency current $I_{DC}$ to the amplifier circuit 58. The voltage amplifier 46 may be configured to source the high-frequency current $I_{Ac}$ concurrent to generating the primary ET voltage $V_{CC}$.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) power amplifier apparatus comprising:
    a first amplifier circuit configured to amplify a first radio frequency (RF) signal;
    a second amplifier circuit configured to amplify a second RF signal; and
    an ET integrated circuit (ETIC) comprising:
        a first output port coupled to the first amplifier circuit;
        a second output port coupled to the second amplifier circuit; and
        a control circuit configured to:
            determine whether the first amplifier circuit and the second amplifier circuit are active to amplify the first RF signal and the second RF signal, respectively;
            cause the second amplifier circuit to amplify the second RF signal based on a non-ET voltage in response to both the first amplifier circuit and the second amplifier circuit being active; and
            cause the second amplifier circuit to amplify the second RF signal based on an ET voltage in response to the first amplifier circuit being inactive and the second amplifier circuit being active.

2. The ET power amplifier apparatus of claim 1, wherein the second amplifier circuit comprises:
    a local amplifier circuit configured to amplify the second RF signal;
    a low dropout regulator (LDO) configured to generate a constant voltage; and
    a local voltage amplifier configured to generate a local ET voltage.

3. The ET power amplifier apparatus of claim 2, wherein the control circuit is further configured to cause the LDO to provide the constant voltage as the non-ET voltage to the local amplifier circuit for amplifying the second RF signal in response to the first amplifier circuit being active.

4. The ET power amplifier apparatus of claim 2, wherein the control circuit is further configured to cause the local voltage amplifier to generate and provide the local ET voltage as the ET voltage to the local amplifier circuit for amplifying the second RF signal in response to the first amplifier circuit being inactive.

5. The ET power amplifier apparatus of claim 4, wherein the control circuit is configured to cause the local voltage amplifier to generate and provide a local high-frequency current to the local amplifier circuit.

6. The ET power amplifier apparatus of claim 2, wherein the ETIC further comprises:
    a tracker circuit configured to generate a low-frequency current; and
    a front-end switch circuit configured to selectively couple the tracker circuit to one of the first output port and the second output port.

7. The ET power amplifier apparatus of claim 6, wherein the front-end switch circuit comprises:
    a first switch provided between the tracker circuit and the first output port; and
    a second switch provided between the tracker circuit and the second output port.

8. The ET power amplifier apparatus of claim 7, wherein the control circuit is further configured to close the first switch and open the second switch to couple the tracker circuit to the first output port to provide the low-frequency current to the first amplifier circuit in response to the first amplifier circuit being active and the second amplifier circuit being inactive.

9. The ET power amplifier apparatus of claim 7, wherein the control circuit is further configured to open the first switch and close the second switch to couple the tracker circuit to the second output port to provide the low-frequency current to the second amplifier circuit in response to the first amplifier circuit being inactive and the second amplifier circuit being active.

10. The ET power amplifier apparatus of claim 7, wherein the control circuit is further configured to close the first switch and the second switch to couple the tracker circuit to the first output port and the second output port to provide the low-frequency current to the first amplifier circuit and the second amplifier circuit, respectively, in response to the first amplifier circuit and the second amplifier circuit both being active.

11. The ET power amplifier apparatus of claim 7, wherein the control circuit is further configured to open the first switch and the second switch to decouple the tracker circuit from the first output port and the second output port, respectively, in response to both the first amplifier circuit and the second amplifier circuit being inactive.

12. The ET power amplifier apparatus of claim 7, wherein the tracker circuit is further configured to generate an average power tracking (APT) voltage.

13. The ET power amplifier apparatus of claim 12, wherein the control circuit is further configured to open the first switch and close the second switch to couple the tracker circuit to the second output port to provide the APT voltage as the non-ET voltage to the second amplifier circuit in response to the first amplifier circuit being inactive and the second amplifier circuit being active.

14. The ET power amplifier apparatus of claim 12, wherein the control circuit is further configured to close the first switch and open the second switch to couple the tracker circuit to the first output port to provide the APT voltage to the first amplifier circuit for amplifying the first RF signal in response to the first amplifier circuit being inactive.

15. The ET power amplifier apparatus of claim 7, wherein the ETIC further comprises a voltage amplifier configured to generate a primary ET voltage at the first output port.

16. The ET power amplifier apparatus of claim 15, wherein the control circuit is further configured to activate the voltage amplifier to provide the primary ET voltage to the first amplifier circuit for amplifying the first RF signal in response to the first amplifier circuit being active.

17. The ET power amplifier apparatus of claim 15, wherein the control circuit is further configured to deactivate the voltage amplifier in response to the first amplifier circuit being inactive.

18. The ET power amplifier apparatus of claim 15, wherein the ETIC further comprises a supply voltage circuit configured to generate and provide at least one supply voltage to the voltage amplifier and the local voltage amplifier.

19. The ET power amplifier apparatus of claim 7, wherein the first amplifier circuit comprises:
   an amplifier circuit configured to amplify the first RF signal; and
   a voltage amplifier configured to generate and provide a primary ET voltage to the amplifier circuit for amplifying the first RF signal.

20. The ET power amplifier apparatus of claim 19, wherein the first amplifier circuit and the second amplifier circuit each comprise a respective local control circuit coupled to the control circuit in the ETIC.

* * * * *